United States Patent
Gunnam et al.

(10) Patent No.: US 8,402,324 B2
(45) Date of Patent: Mar. 19, 2013

(54) COMMUNICATIONS SYSTEM EMPLOYING LOCAL AND GLOBAL INTERLEAVING/DE-INTERLEAVING

(75) Inventors: Kiran Gunnam, San Jose, CA (US); Yang Han, Santa Clara, CA (US)

(73) Assignee: LSI Corporation, San Jose, CA (US)

( * ) Notice: Subject to any disclaimer, the term of this patent is extended or adjusted under 35 U.S.C. 154(b) by 347 days.

(21) Appl. No.: 12/891,161

(22) Filed: Sep. 27, 2010

(65) Prior Publication Data
US 2012/0079340 A1 Mar. 29, 2012

(51) Int. Cl.
*G06F 11/00* (2006.01)

(52) U.S. Cl. ........................................ 714/701; 714/776

(58) Field of Classification Search ................... 714/701, 714/776
See application file for complete search history.

(56) References Cited

U.S. PATENT DOCUMENTS

| | | | |
|---|---|---|---|
| 5,287,491 A | 2/1994 | Hsu | |
| 5,757,795 A | 5/1998 | Schnell | |
| 6,157,643 A | 12/2000 | Ma | |
| 7,911,364 B1 | 3/2011 | Zhang et al. | |
| 8,065,598 B1 | 11/2011 | Gunnam et al. | |
| 8,099,561 B2 | 1/2012 | Bayer et al. | |
| 8,161,345 B2 | 4/2012 | Graef | |
| 8,170,129 B2 * | 5/2012 | Chang et al. | 375/265 |
| 8,265,070 B2 | 9/2012 | Khanduri | |
| 2001/0007608 A1 | 7/2001 | Sugita et al. | |
| 2002/0108030 A1 | 8/2002 | Lee et al. | |
| 2003/0112797 A1 | 6/2003 | Li et al. | |
| 2005/0015234 A1 | 1/2005 | Bhattacharya et al. | |
| 2006/0179401 A1 * | 8/2006 | Nefedov | 714/800 |
| 2006/0282712 A1 | 12/2006 | Argon et al. | |
| 2007/0011569 A1 | 1/2007 | Vila Casado et al. | |
| 2007/0208988 A1 | 9/2007 | Aman et al. | |
| 2008/0028272 A1 | 1/2008 | Richardson | |
| 2008/0056202 A1 * | 3/2008 | Kim et al. | 370/335 |
| 2008/0301536 A1 | 12/2008 | Shin et al. | |
| 2008/0320353 A1 | 12/2008 | Blankenship et al. | |
| 2009/0024909 A1 | 1/2009 | Shen et al. | |
| 2009/0077447 A1 | 3/2009 | Buckley et al. | |
| 2009/0083606 A1 | 3/2009 | Choi et al. | |

(Continued)

OTHER PUBLICATIONS

Jaros, J., "Evolutionary Optimization of Multistage Interconnection Networks Performance," Jul. 8, 2009; GECCO 09.

(Continued)

*Primary Examiner* — M. Mujtaba K Chaudry
(74) *Attorney, Agent, or Firm* — Mendelsohn, Drucker & Associates, P.C.; Craig M. Brown; Steve Mendelsohn (57) ABSTRACT

In one embodiment, a communications system has a write path and a read path. In the write path, a local/global interleaver interleaves a user data stream, and an error-correction (EC) encoder encodes the user data stream to generate an EC codeword. A local/global de-interleaver de-interleaves the parity bits of the EC codeword, and both the original un-interleaved user data and the de-interleaved parity bits are transmitted via a noisy channel. In the read path, a channel detector recovers channel soft-output values corresponding to the codeword. A local/global interleaver interleaves the channel values, and an EC decoder decodes the interleaved values to recover the original codeword generated in the write path. A de-multiplexer de-multiplexes the user data from the parity bits. Then, a local/global de-interleaver de-interleaves the user data to obtain the original sequence of user data that was originally received at the write path.

19 Claims, 6 Drawing Sheets

U.S. PATENT DOCUMENTS

| | | | | |
|---|---|---|---|---|
| 2009/0180535 | A1* | 7/2009 | Bretl et al. | 375/240.01 |
| 2009/0224801 | A1 | 9/2009 | Lewin | |
| 2010/0111014 | A1 | 5/2010 | Kang et al. | |
| 2010/0118800 | A1 | 5/2010 | Kim et al. | |
| 2010/0169738 | A1 | 7/2010 | Wu et al. | |
| 2010/0189162 | A1* | 7/2010 | Yoshimoto et al. | 375/141 |
| 2010/0214857 | A1 | 8/2010 | Hsu et al. | |
| 2011/0093762 | A1 | 4/2011 | Kwon et al. | |
| 2012/0079340 | A1 | 3/2012 | Gunnam et al. | |
| 2012/0176856 | A1 | 7/2012 | Hsu et al. | |

OTHER PUBLICATIONS

Schack, C. et al., A Multiprocessor Architecture with an Omega Network for the Massively Parallel Model GCA, 2009, Springer-Verlag.

Gunnam, Kiran K. et al., "VLSI Architectures for Layered Decoding forIrregular LDPC Codes of WiMax," IEEE Communications Society, ICC 2007 Proceedings, pp. 4542-4547.

Gunnam, Kiran K. et al., "Technical Note on Iterative LDPC Solutions for Turbo Equalization," Department of ECE, Texas A&M University, College Station, TX-77843, Jul. 2006, pp. 1-5.

Al-Qerem, Ahmad H. "Congestion Control by Using a Bufferred Omega Network," IADIS International Conference on Applied Computing 2005, pp. 429-434.

Mahajan, Rita and Vig, Dr. Renu, "Performance and Reliability Analysis of New Fault-Tolerant Advance Omega Network," WSEAS Transactions on Computers, Issue 8, vol. 7, Aug. 2008, pp. 1280-1290.

Aljundi, Ahmad Chadi et al., "A Study of an Evaluation Methodology for Unbuffered Multistage Interconnection Networks,"IPDPS '03 Proceedings of the 17th International Symposium on Parallel and Distributed Processing, 2003, pp. 1-8.

K. Gunnam et al., "Value-Reuse Properties of Min-Sum for Gf(q)" (dated Oct. 2006) Dept. of ECE, Texas A&M University Technical Note, published about Aug. 2010.

K. Gunnam et al., "Value-Reuse Properties of Min-Sum for Gf (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

* cited by examiner

FIG. 1

$$H = \begin{pmatrix} B_{1,1} & B_{1,2} & B_{1,3} & B_{1,4} & B_{1,5} & B_{1,6} & B_{1,7} & B_{1,8} & B_{1,9} & B_{1,10} & B_{1,11} & B_{1,12} \\ B_{2,1} & B_{2,2} & B_{2,3} & B_{2,4} & B_{2,5} & B_{2,6} & B_{2,7} & B_{2,8} & B_{2,9} & B_{2,10} & B_{2,11} & B_{2,12} \\ B_{3,1} & B_{3,2} & B_{3,3} & B_{3,4} & B_{3,5} & B_{3,6} & B_{3,7} & B_{3,8} & B_{3,9} & B_{3,10} & B_{3,11} & B_{3,12} \\ B_{4,1} & B_{4,2} & B_{4,3} & B_{4,4} & B_{4,5} & B_{4,6} & B_{4,7} & B_{4,8} & B_{4,9} & B_{4,10} & B_{4,11} & B_{4,12} \end{pmatrix}$$

COMMUNICATIONS SYSTEM EMPLOYING LOCAL AND GLOBAL INTERLEAVING/DE-INTERLEAVING

CROSS-REFERENCE TO RELATED APPLICATIONS

The subject matter of this application is related to:
U.S. patent application Ser. No. 12/113,729 filed May 1, 2008,
U.S. patent application Ser. No. 12/113,755 filed May 1, 2008,
U.S. patent application Ser. No. 12/323,626 filed Nov. 26, 2008,
U.S. patent application Ser. No. 12/401,116 filed Mar. 10, 2009,
U.S. patent application Ser. No. 12/675,981 filed on Mar. 2, 2010,
U.S. patent application Ser. No. 12/677,322 filed Mar. 10, 2010,
U.S. patent application Ser. No. 12/680,810 filed Mar. 30, 2010,
U.S. patent application Ser. No. 12/524,418 filed on Jul. 24, 2009,
U.S. patent application Ser. No. 12/420,535 filed Apr. 8, 2009,
U.S. patent application Ser. No. 12/475,786 filed Jun. 1, 2009,
U.S. patent application Ser. No. 12/260,608 filed on Oct. 29, 2008,
PCT patent application No. PCT/US09/41215 filed on Apr. 21, 2009,
U.S. patent application Ser. No. 12/427,786 filed on Apr. 22, 2009,
U.S. patent application Ser. No. 12/492,328 filed on Jun. 26, 2009,
U.S. patent application Ser. No. 12/492,346 filed on Jun. 26, 2009,
U.S. patent application Ser. No. 12/492,357 filed on Jun. 26, 2009,
U.S. patent application Ser. No. 12/492,374 filed on Jun. 26, 2009,
U.S. patent application Ser. No. 12/538,915 filed on Aug. 11, 2009,
U.S. patent application Ser. No. 12/540,078 filed on Aug. 12, 2009,
U.S. patent application Ser. No. 12/540,035 filed on Aug. 12, 2009,
U.S. patent application Ser. No. 12/540,002 filed on Aug. 12, 2009,
U.S. patent application Ser. No. 12/510,639 filed on Jul. 28, 2009,
U.S. patent application Ser. No. 12/524,418 filed on Jul. 24, 2009,
U.S. patent application Ser. No. 12/510,722 filed on Jul. 28, 2009,
U.S. patent application Ser. No. 12/510,667 filed on Jul. 28, 2009,
U.S. patent application Ser. No. 12/644,622 filed on Dec. 22, 2009,
U.S. patent application Ser. No. 12/644,181 filed on Dec. 22, 2009,
U.S. patent application Ser. No. 12/766,038 filed on Apr. 23, 2010,
U.S. patent application Ser. No. 12/827,652 filed on Jun. 30, 2010,
U.S. patent application Ser. No. 12/644,314 filed on Dec. 22, 2009,
U.S. patent application Ser. No. 12/826,026 filed on Jun. 29, 2010, and
U.S. patent application Ser. No. 12/835,989 filed on Jul. 14, 2010,
the teachings of all of which are incorporated herein by reference in their entirety.

BACKGROUND OF THE INVENTION

1. Field of the Invention

The present invention relates to signal processing, and, more specifically but not exclusively, to techniques for interleaving and de-interleaving data.

2. Description of the Related Art

To reduce the effects that burst errors in a transmission channel have on recovering data at a receiver, many data transmission systems employ data interleaving schemes. In a first possible implementation of a system employing both error-correction encoding and interleaving, at the transmitter, un-interleaved data is encoded, and the resulting encoded codeword is interleaved for transmission. At the receiver, the received encoded codeword is de-interleaved and then decoded to recover the original data stream. In this implementation, the data is encoded in an un-interleaved domain, and the codeword is transmitted in an interleaved domain.

In a second possible implementation, the data is encoded in an interleaved domain and transmitted in an un-interleaved domain. In this implementation, at the transmitter, the data is first interleaved, and the resulting interleaved data is encoded to generate an encoded codeword. The resulting parity bits are de-interleaved and multiplexed with the un-interleaved data for transmission. Note that the de-interleaved domain is identical to the original un-interleaved domain. At the receiver, in order to be able to decode the encoded codeword in the interleaved domain, the received encoded codeword is interleaved prior to decoding. After decoding, the resulting decoded data is then de-interleaved to output the recovered data in the original un-interleaved domain.

SUMMARY OF THE INVENTION

In one embodiment, the present invention is a communications transmitter adapted to convert an input data stream into an encoded data stream for transmission. The communications transmitter comprises a local/global interleaver, an error-correction encoder, a local/global de-interleaver, and a multiplexer. The local/global interleaver is adapted to perform both local and global interleaving on the input data stream to generate an interleaved input data stream. The error-correction encoder is adapted to encode the interleaved input data stream to generate a stream of interleaved parity values corresponding to an error-correction-encoded codeword. The local/global de-interleaver is adapted to perform both local and global de-interleaving on the stream of interleaved parity values to generate a stream of de-interleaved parity values. The multiplexer is adapted to multiplex the input data stream and the de-interleaved parity values to generate the encoded data stream.

In another embodiment, the present invention is a communications implemented method for converting an input data stream into an encoded data stream for transmission. The method comprises performing both local and global interleaving on the input data stream to generate an interleaved input data stream. The interleaved input data stream is error-correction encoded to generate a stream of interleaved parity values corresponding to an error-correction-encoded codeword. Both local and global de-interleaving are performed on the stream of interleaved parity values to generate a stream of de-interleaved parity values. The input data stream and the de-interleaved parity values are then multiplexed to generate the encoded data stream.

In yet another embodiment, the present invention is a communications receiver adapted to recover, from an encoded data stream, an original data stream. The communications receiver comprises a local/global interleaver, an error-correction decoder, and a local/global de-interleaver. The local/global interleaver is adapted to perform both local and global interleaving on a stream of channel values to generate a stream of interleaved channel values, wherein each channel value corresponds to a value in the encoded data stream. The error-correction decoder is adapted to decode the stream of interleaved channel values to recover an error-correction-encoded codeword, wherein the error-correction-encoded codeword comprises both data values and parity values. The local/global de-interleaver is adapted to perform both local and global de-interleaving on the data values of the error-correction-encoded codeword to generate the original data stream.

In yet still another embodiment, the present invention is a communications receiver implemented method for recovering, from an encoded data stream, an original data stream. The method comprises performing both local and global interleaving on a stream of channel values to generate a stream of interleaved channel values, wherein each channel value corresponds to a value in the encoded data stream. The stream of interleaved channel values is error-correction decoded to recover an error-correction-encoded codeword, wherein the error-correction-encoded codeword comprises both data values and parity values. Both local and global de-interleaving are performed on the data values of the error-correction-encoded codeword to generate the original data stream.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The present invention relates to communications systems that employ the second type of interleaving scheme discussed in the background. As described below, communications systems of the present invention employ (i) interleavers that perform both local interleaving and global interleaving and (ii) de-interleavers that perform both local de-interleaving and global de-interleaving. A discussion of exemplary local/global interleavers and local/global de-interleavers may be found in U.S. patent application Ser. No. 12/835,989.

Figure 1:
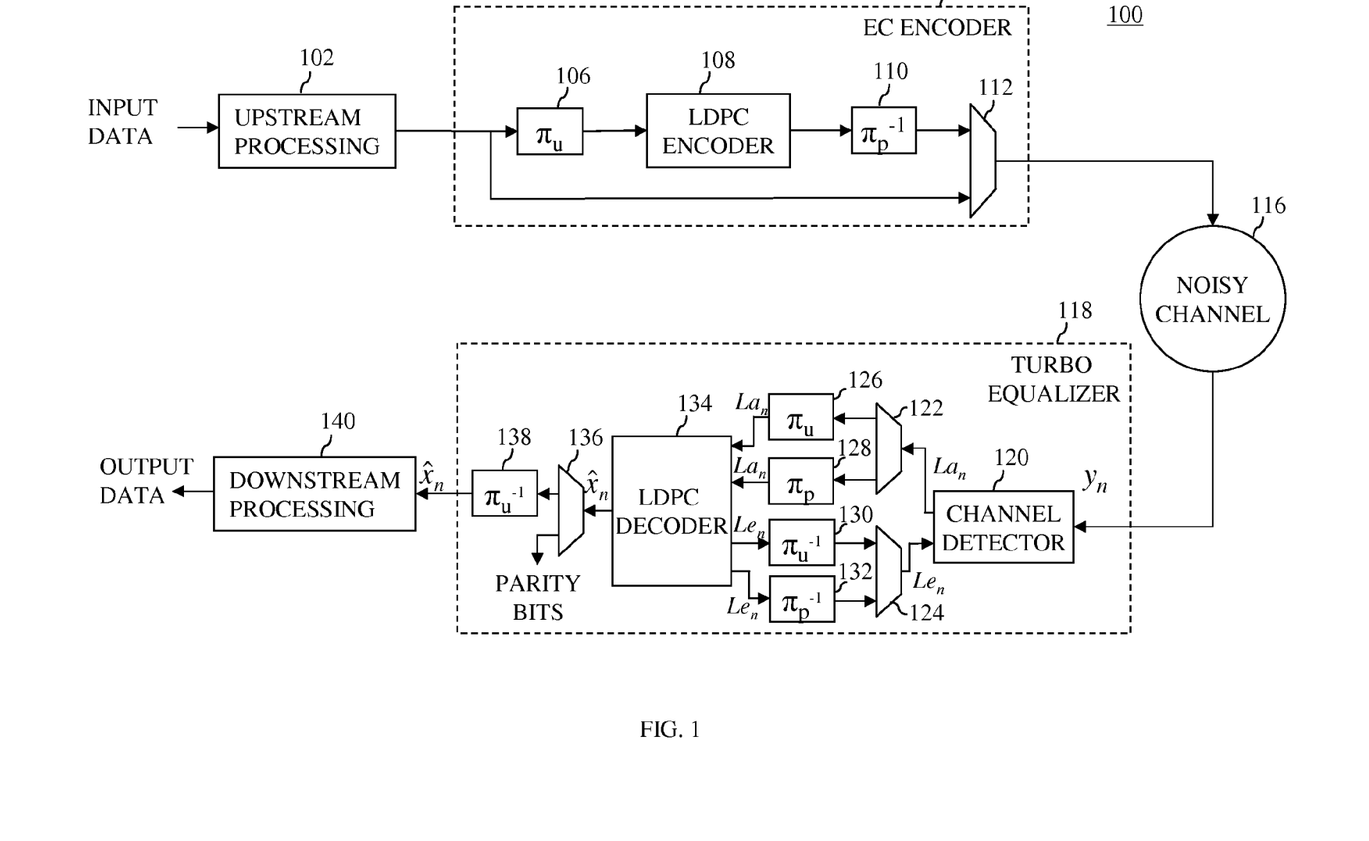
FIG. 1 shows a simplified block diagram of a communications system according to one embodiment of the present invention.

FIG. 1 shows a simplified block diagram of a communications system 100 according to one embodiment of the present invention. Communications system 100 has (i) an upper path, herein referred to as the write path, in which an input data stream is processed and transmitted over noisy channel 116, and (ii) a lower path, herein referred to as the read path, in which data is received from noisy channel 116 and processed to recover the original input data stream that was transmitted by the write path. Communications system 100 may be any communications system suitable for transmitting an input data stream, such as a wireless communications system or a hard-disk drive (HDD) system. When implemented as a wireless communications system, noisy channel 116 is a wireless transmission medium, and, when implemented as an HDD system, noisy channel 116 is a hard-disk platter.

In the write path, upstream processing 102 receives an input user-data stream from, for example, a user application. Upstream processing 102 may implement an error-detection encoding scheme such as cyclic-redundancy-check (CRC) encoding or any other suitable error-detection encoding scheme. Upstream processing 102 may also perform other suitable processing, such as run-length encoding, to prepare the input user-data stream for processing by error-correction (EC) encoder 104.

Upstream processing 102 provides the input user-data stream to EC encoder 104, which prepares the input data stream for transmission over noisy channel 116. EC encoder 104 implements the second type of interleaving scheme described in the background to reduce the effects that burst errors have on recovering the input data stream after it is transmitted over noisy channel 116. In so doing, the data is encoded in an interleaved domain and transmitted in an un-interleaved domain. As shown, the input user-data stream is provided to local/global interleaver 106 and the lower input of parity insertion multiplexer 112. Local/global interleaver 106 interleaves the input data stream using an interleaving scheme $\pi_u$, and provides the interleaved input data stream to low-density parity-check (LDPC) encoder 108.

LDPC encoder 108 encodes the interleaved input data stream using LDPC encoding to generate an LDPC-encoded codeword. The parity bits of the LDPC-encoded codeword are then de-interleaved using local/global de-interleaver 110, which implements a de-interleaving scheme $\pi_p^{-1}$, and the de-interleaved parity bits are provided to the upper input of multiplexer 112. Multiplexer 112 outputs the input (un-interleaved) user-data stream, and in so doing, inserts the de-interleaved parity bits within the input user-data stream. For example, multiplexer 112 may insert one nibble of parity bits for every eight nibbles of user-data bits, where a nibble is a group of four bits. The LDPC-encoded codeword may then be processed using further processing (not shown), such as digital-to-analog conversion, pre-amplification, and possibly other suitable processing to prepare the LDPC-encoded codeword for transmission over noisy channel 116.

In the read path, turbo equalizer 118 receives codewords transmitted over noisy channel 116. The codewords may be pre-processed using processing (not shown), such as amplification, analog-to-digital conversion, finite-impulse-response (FIR) filtering, equalization, and possibly other processing suitable for preparing codewords for decoding. Samples $y_n$ of the retrieved codewords are provided to turbo equalizer 118, which has at least one channel detector 120 and at least one LDPC decoder 134. Turbo equalizer 118 may be implemented in many different ways, and the details of turbo equalizer 118 are provided merely to illustrate the basic components of an exemplary turbo equalizer.

For each LDPC-encoded codeword processed, a set of samples $y_n$ is provided to channel detector 120, where each sample $y_n$ corresponds to a bit of the LDPC-encoded codeword. Channel detector 120 implements a suitable channel-detection technique, such as Viterbi soft-output detection or maximum a posteriori (MAP) detection, to generate a channel soft-output value $La_n^{(0)}$ (e.g., a log-likelihood ratio (LLR)) corresponding to each bit n of the LDPC-encoded codeword. As used herein, the term "soft-output value" refers to a value comprising a hard-decision bit (i.e., the most-significant bit) and at least one confidence value bit (i.e., the least-significant bits).

Channel detector 120 provides the channel soft-output values $La_n^{(0)}$ to de-multiplexer 122, which de-multiplexes the channel soft-output values $La_n^{(0)}$ corresponding to the user-data bits of the LDPC-encoded codeword from the channel soft-output values $La_n^{(0)}$ corresponding to the parity bits. The user-data channel soft-output values $La_n^{(0)}$ are interleaved by local/global interleaver 126, which implements an interleaving mapping $\pi_u$ that corresponds to the interleaving mapping of local/global interleaver 106. Thus, the sequence of user-data channel soft-output values $La_n^{(0)}$ output from local/global interleaver 126 corresponds to the sequence of user-data bits output by local/global interleaver 106. The parity channel soft-output values $La_n^{(0)}$ are interleaved by local/global interleaver 128, which implements an interleaving mapping $\pi_p$ that is the inverse of the de-interleaving mapping $\pi_p^{-1}$ used by local/global de-interleaver 110. Thus, the sequence of parity channel soft-output values $La_n^{(0)}$ output by local/global interleaver 128 corresponds to the sequence of parity bits input to local/global de-interleaver 110.

Local/global interleavers 126 and 128 output their respective interleaved channel soft-output values $La_n^{(0)}$ to LDPC decoder 134, which implements LDPC decoding to recover the correct LDPC-encoded codeword. In so doing, LDPC decoder 134 generates a set of updated soft-output values $P_n$, where each value $P_n$ corresponds to the $n^{th}$ bit of the LDPC-encoded codeword and each updated soft-output value $P_n$ comprises a hard-decision bit $x_n$ and a confidence value. The hard-decision bits $x_n$ corresponding to user data, herein referred to as user-data hard-decision bits $x_n$, are de-multiplexed from the hard-decision bits $x_n$ corresponding to parity bits, herein referred to as parity hard-decision bits $x_n$, using de-multiplexer 136.

The user-data hard-decision bits $x_n$ are de-interleaved using local/global de-interleaver 138, which implements a de-interleaving mapping $\pi_u^{-1}$ that is the inverse of the interleaving mapping $\pi_u$ used by local/global interleaver 106. Thus, the sequence of user-data hard-decision bits $x_n$ output from local/global de-interleaver 138 corresponds to the original sequence of un-interleaved user-data bits that is input to local/global interleaver 106.

The de-interleaved user-data hard-decision bits $x_n$ are provided to downstream processing 140, which may perform, for example, a cyclic-redundancy check (CRC) to determine whether the codeword recovered is the correct codeword (i.e., the codeword that was generated by the write path). The parity hard-decision bits $x_n$ may be used for debugging or other purposes, but are not typically provided downstream along with the user-data hard-decision bits $x_n$.

In addition to outputting hard-decision bits $x_n$, LDPC decoder 134 may output an extrinsic soft-output value $Le_n$ for each bit n of the LDPC-encoded codeword as shown in Equation (1) below:

$$Le_n = P_n - La_n^{(0)}. \qquad (1)$$

The extrinsic soft-output values $Le_n$ corresponding to the user-data bits are de-interleaved by local/global de-interleaver 130, which implements a de-interleaving mapping $\pi_u^{-1}$ that is the inverse of the interleaving mapping $\pi_u$ used by local/global interleaver 106. The parity extrinsic soft-output values $Le_n$ are de-interleaved by local/global de-interleaver 132, which implements a de-interleaving mapping $\pi_p^{-1}$ that corresponds to the de-interleaving mapping $\pi_p^{-1}$ used by local/global de-interleaver 110. The de-interleaved user-data extrinsic soft-output values $Le_n$ and the de-interleaved parity extrinsic soft-output values $Le_n$ are multiplexed by multiplexer 124 and provided to channel detector 120, which uses the extrinsic soft-output values $Le_n$ to improve detection. For example, in Viterbi detection, the extrinsic soft-output values $Le_n$ are used to improve the branch-metric calculation.

Note that, for ease of discussion, this specification uses the terms "interleaver," "interleaving," "de-interleaver," and "de-interleaving" relative to the order of bits of the LDPC-encoded codeword. For example, component 126 of system 100 is referred to as an "interleaver" because component 126 (i) receives channel soft-output values $La_n^{(0)}$ from channel detector 120 in an order that corresponds to the order of bits in the un-interleaved LDPC-encoded codeword output by multiplexer 112, and (ii) outputs channel soft-output values $La_n^{(0)}$ in an order, herein referred to as the "codeword order," that corresponds to the order of bits in the interleaved LDPC-encoded codeword.

However, component 126 may also be considered to be a "de-interleaver" relative to the order in which bits are transmitted over noisy channel 116. For example, component 126 may be referred to as a "de-interleaver" because component 126 (i) receives channel soft-output values $La_n^{(0)}$ from channel detector 120 in an order that does not correspond to the codeword order, herein referred to as the "channel order," and (ii) outputs channel soft-output values $La_n^{(0)}$ in an order other than the channel order (i.e., the codeword order). Analogous to component 126, components 106, 110, 128, 130, 132, and 138 may also be referred to as either "interleavers" or "de-interleavers."

Further, it is important to note that interleavers 106, 126 and 128, and de-interleavers 110, 130, 132, and 138 could be implemented in systems other than system 100, including systems that do not employ LDPC encoding/decoding. In such systems, the use of the terms "interleaver," "interleaving," "de-interleaver," and "de-interleaving" might not be used relative to the order of bits of an LDPC-encoded codeword. Rather, they might be used relative to some other order in which the values are received and/or output.

Thus, although the terms "interleaver" and "interleaving" are used to refer to certain components in this specification, it will be understood that the terms "de-interleaver" and "de-interleaving" may also be used interchangeably to refer to those components. Similarly, although the terms "de-interleaver" and "de-interleaving" are used to refer to certain other components in this specification, it will be understood that the terms "interleaver" and "interleaving" may also be used interchangeably to refer to those other components.

In light of the previous explanation, as used in the claims, unless made explicitly clear in the claim, the terms "interleaver" and "de-interleaver" are interchangeable, and the terms "interleaving" and "de-interleaving" are interchangeable. For example, a system having a transmitter with an interleaver and a receiver with a corresponding de-interleaver, could be equivalently referred to as a system having a transmitter with a de-interleaver and a receiver with a corresponding interleaver.

The design of interleaver 126 and de-interleaver 128 should take into account the processing performed by channel detector 120. For example, interleaver 126 should be capable of receiving channel soft-output values $La_n^{(0)}$ at the rate at which the channel soft-output values $La_n^{(0)}$ are output from channel detector 120. In embodiments that implement two or more channel detectors to process multiple streams of the same sector, interleaver 126 should be capable of receiving channel soft-output values $La_n^{(0)}$ at the rate at which the channel soft-output values $La_n^{(0)}$ are output from the multiple channel detectors.

Figure 2:
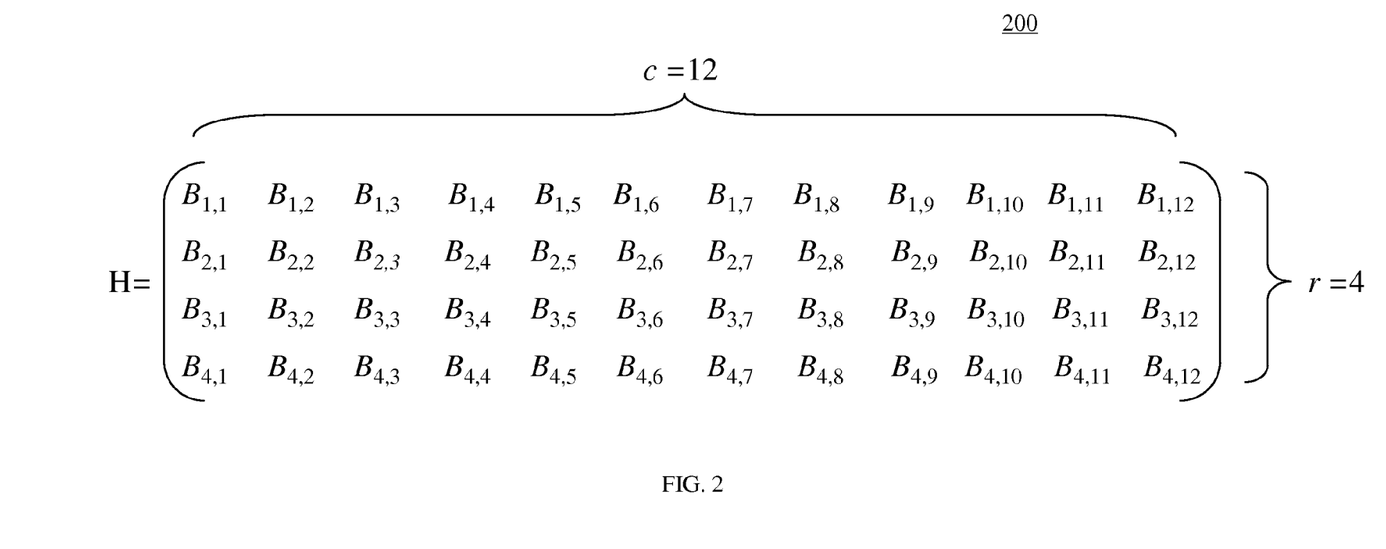
FIG. 2 shows one implementation of a quasi-cyclic (QC) parity-check matrix.

FIG. 2 shows one implementation of a quasi-cyclic (QC) parity-check matrix 200. Parity-check matrix 200, commonly referred to as an H-matrix, comprises 48 circulants $B_{j,k}$ that are arranged in (i) r=4 rows of circulants, herein referred to as block rows, where j=1, ..., r and (ii) c=12 columns of circulants, herein referred to as block columns, where k=1, ..., c. A circulant is a sub-matrix that is either an identity matrix or is obtained by cyclically shifting an identity matrix, and a quasi-cyclic LDPC code is an LDPC code in which all of the sub-matrices are circulants. In H-matrix 200, each circulant $B_{j,k}$ is a p×p sub-matrix that may be obtained by cyclically shifting a single p×p identity matrix. For purposes of this discussion, assume that p=96 such that H-matrix 200 has p×r=96×4=384 total rows and p×c=96×12=1,152 total columns.

Since each circulant $B_{j,k}$ is a permutation of an identity matrix, the hamming weight (i.e., the number of entries having a value of one) of each column in a circulant and the hamming weight of each row in a circulant are both equal to 1. Thus, the total hamming weight $w_r$ for each row of H-matrix 200 is equal to 1×c=1×12=12, and the total hamming weight $w_c$ for each column of H-matrix 200 is equal to 1×r=1×4=4. Each of the 384 individual rows of H-matrix 200 corresponds to an $m^{th}$ check node, where m ranges from 1, ..., 384, and each of the 1,152 columns corresponds to an $n^{th}$ variable node (also referred to as a bit node), where n ranges from 1, ..., 1,152. Further, each check node is connected to $w_r$=12 variable nodes row (i.e., the check-node degree=12) as indicated by the 1s in a row, and each variable node is connected to $w_c$=4 check nodes (i.e., the variable-node degree=4) as indicated by the 1s in a column. H-matrix 200 may be described as a regular LDPC code since all rows of H-matrix 200 have the same hamming weight $w_r$ and all columns of H-matrix 200 have the same hamming weight $w_c$.

Each individual column of H-matrix 200 corresponds to one bit of the LDPC-encoded codeword, and thus, an LDPC encoded codeword based on H-matrix 200 has N=1,152 total bits. The p (e.g., 96) individual columns in each block column of H-matrix 200 may correspond to (i) all data bits, (ii) all parity bits, or (iii) a combination of data and parity bits. For this discussion, suppose that the number K of bits corresponding to data is equal to 768 (i.e., 8 block columns×96 individual columns per block column=768) and the number (N-K) of bits corresponding to parity is equal to 384 (i.e., 1,125−768=384). Further, suppose that all of the individual columns in block columns 1-4 correspond to only parity bits, herein referred to as parity block columns, while all of the individual columns in block columns 5-12 correspond to only data bits, herein referred to as user-data block columns.

Typically, LDPC decoders are designed to receive all of the channel soft-output values $La_n^{(0)}$ corresponding to one or more full block columns of the corresponding H-matrix at a time, and initiate the updates of the one or more full block columns as soon as they are received. The channel soft-output values $La_n^{(0)}$ may be received and processed in numerical order (e.g., from block column 1 to block column 12) or may be received and processed in another order, depending on the order in which the LDPC decoder is designed to process the channel soft-output values $La_n^{(0)}$. For ease of discussion, numerical order is used in all examples in this specification. Thus, for this discussion, assume that LDPC decoder 134 receives 96 channel soft-output values $La_n^{(0)}$ per clock cycle, and receives the soft-output values $La_n^{(0)}$ in order from block column 1 to block column 12. However, it will be understood that, in other embodiments, the values may be arranged in an order other than numerical order.

Figure 3:
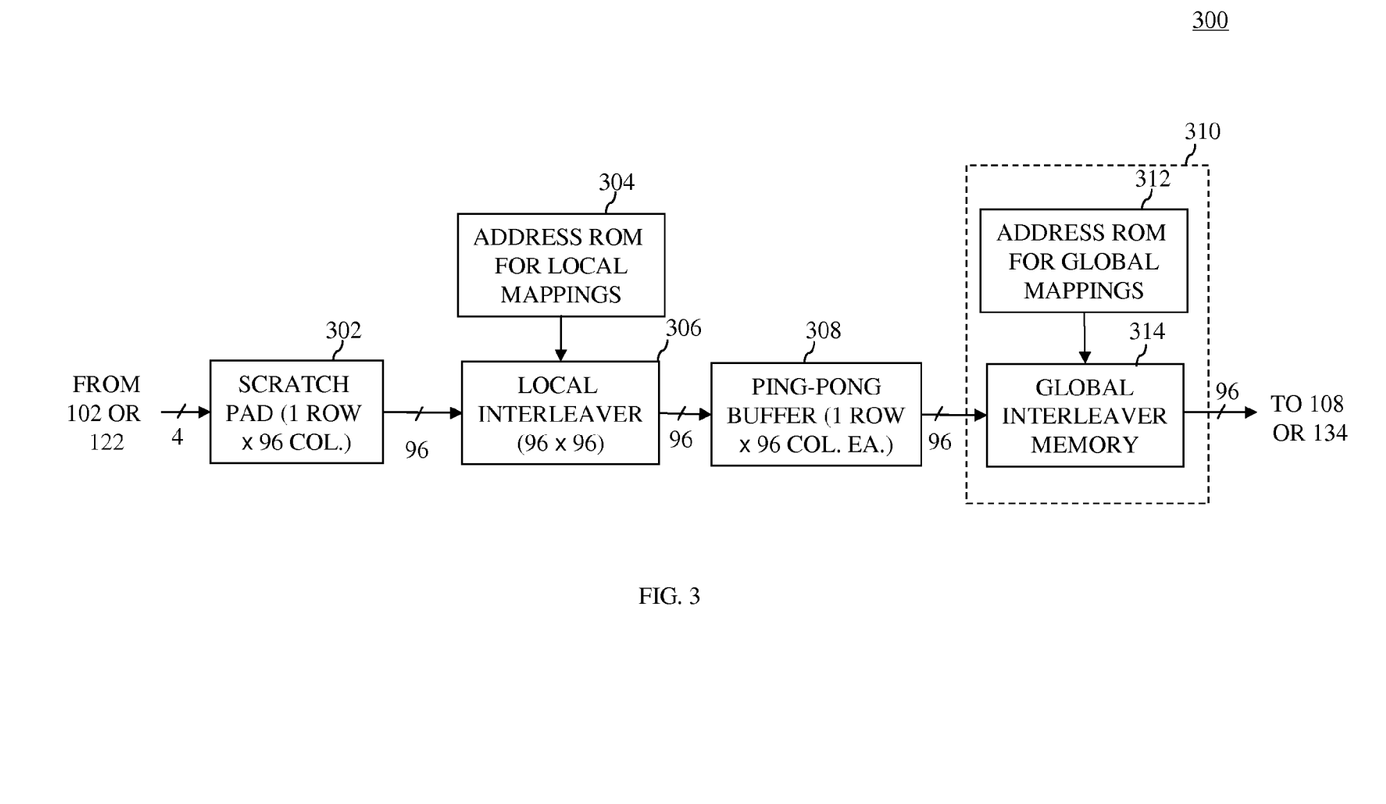
FIG. 3 shows a simplified block diagram of a local/global interleaver according to one embodiment of the present invention that may be used to implement each of the local/global interleavers in FIG. 1.

FIG. 3 shows a simplified block diagram of a local/global interleaver 300 according to one embodiment of the present invention that may be used to implement each of local/global interleavers 106, 126, and 128 in FIG. 1. Discussions of interleavers that operate in a manner similar to interleaver 300 may be found in U.S. patent application Ser. No. 12/835,989 and in K. Gunnam, et al., *Technical Note on Iterative LDPC Solutions for Turbo Equalization*, Texas A&M Technical Note, July 2006 (available online at http://dropzone.tamu.edu), the teachings of which are incorporated herein by reference in their entirety. When used to implement each of interleavers 106, 126, and 128, one skilled in the art would recognize that various parameters used by interleaver 300 may vary depending on which interleaver is being implemented. For example, the size of global interleaver memory 314 may vary, and the size of the values processed by interleaver 300 (e.g., bits vs. soft-values) may vary. For ease of discussion, interleaver 300 is discussed relative to its use in implementing interleaver 126.

Interleaver 300 has scratch pad memory 302, which has one row for storing p (e.g., 96) user-data channel soft-output values $La_n^{(0)}$ (i.e., one soft-output value $La_n^{(0)}$ for each individual column of a user-data block column of H-matrix 200). Scratch pad 302 receives four user-data soft-output values $La_n^{(0)}$ per clock cycle from, for example, channel detector 120 of FIG. 1, and accumulates 96 user-data channel soft-output values $La_n^{(0)}$ over 24 clock cycles (i.e., 96 total samples/4 samples per clock cycle=24 clock cycles). The 96 user-data channel soft-output values $La_n^{(0)}$ correspond to only one user-data block column of H-matrix 200. After 96 user-data channel soft-output values $La_n^{(0)}$ have been accumulated, they are output in parallel to local interleaver 306, and scratch pad 302 then begins receiving soft-output values corresponding to another user-data block column. Note that the sets of 96 user-data channel soft-output values $La_n^{(0)}$ corresponding to user-data block columns 5 to 12 need not be received in order from block columns 5 to 12.

Local interleaver 306 is a p×p (e.g., 96×96) interleaver that may be implemented using any suitable interleaver, such as a cyclic-shift interleaver, a convolutional interleaver, or an interleaver that performs more-random interleaving than cyclic-shift interleavers and convolutional interleavers. For each set of 96 user-data channel soft-output values $La_n^{(0)}$ received, local interleaver 306 receives a local interleaving mapping instruction $\pi_{uL}$ from address ROM 304. The local mapping instruction $\pi_{uL}$ may be, and preferably is, different from one set of 96 user-data channel soft-output values $La_n^{(0)}$ to the next (i.e., local mapping instructions $\pi_{uL}$ range from $\pi_{uL}(1)$ to $\pi_{uL}(8)$, one for each of the 8 user-data block columns of H-matrix 200). For example, suppose that local interleaver 306 is implemented as a cyclic-shift interleaver. For a first set of 96 user-data channel soft-output values $La_n^{(0)}$, address ROM 304 may provide a cyclic-shift value of 36 to local interleaver 306 such that local interleaver 306 cyclically shifts the first set of 96 user-data channel soft-output values $La_n^{(0)}$ by a value of 36. For a second set of 96 user-data channel soft-output values $La_n^{(0)}$, address ROM 304 may provide a cyclic-shift value of 88 to local interleaver 306 such that local interleaver 306 cyclically shifts the second set of 96 user-data channel soft-output values $La_n^{(0)}$ by a value of 88.

After the 96 user-data channel soft-output values $La_n^{(0)}$ in each set are interleaved by local interleaver 306, the 96 interleaved user-data channel soft-output values $La_n^{(0)}$ are written to a register of ping-pong buffer 308. Ping-pong buffer 308 has two registers, each capable of storing a set of 96 interleaved user-data channel soft-output values $La_n^{(0)}$. In operation, one set is written to one of the ping-pong registers as another set is read from the other of the ping-pong registers. After receiving the 96 interleaved user-data channel soft-output values $La_n^{(0)}$, the channel soft-output values $La_n^{(0)}$ are read out in parallel to global interleaver 310.

Global interleaver 310 comprises global interleaver memory 314 and address ROM 312, which together implement a global interleaving mapping $\pi_{uG}$ to interleave the sets of locally interleaved user-data channel soft-output values $La_n^{(0)}$ with one another. Local and global interleaving mappings $\pi_{uL}$ and $\pi_{uG}$ make up the overall interleaving mapping $\pi_u$ employed by local/global interleaver 126. Global interleaver 310 may be shared between local/global interleavers 126 and 128. In such a case, global interleaver memory 314 comprises 1,152 addresses, one corresponding to each column of H-matrix 200. The 1,152 addresses are arranged in 12 rows, where each row stores p (e.g., 96) channel soft-output values $La_n^{(0)}$ corresponding to either one user-data block column or one parity block column of H-matrix 200. Alternatively, global interleaver 310 could be used solely by local/global interleaver 126. In such a case, global interleaver memory 314 comprises 768 addresses, one corresponding to each individual user-data column of H-matrix 200. The 768 addresses are arranged in 8 rows, where each row stores p (e.g., 96) channel soft-output values $La_n^{(0)}$ corresponding to a different user-data block column of H-matrix 200.

Global interleaver memory 314 also has one input port and one output port. The input port provides access for write operations to only one row of global interleaver memory 314 at a time (i.e., all 96 addresses). Similarly, the output port provides access for read operations to only one row of global interleaver memory 314 at a time (i.e., all 96 addresses). For each set of 96 user-data channel soft-output values $La_n^{(0)}$, address ROM 312 provides an address identifier to global interleaver memory 314, which identifies the row of global interleaver memory 314 to which the 96 user-data channel soft-output values $La_n^{(0)}$ are written. The 96 user-data channel soft-output values $La_n^{(0)}$ are then written via the input port to the row corresponding to the address identifier.

After all of the channel soft-output values $La_n^{(0)}$ are stored in global interleaver memory 314, they are output to, for example, LDPC decoder 134 of FIG. 1. In this case, global interleaver memory 314 may be treated as internal memory of LDPC decoder 134, and the order in which the rows are accessed may be determined by the LDPC decoder scheduler. LDPC decoder 134 may access global interleaver memory 314 one row (i.e., 96 values) per clock cycle or multiple rows per clock cycle. The particular row output is determined by an address supplied by LDPC decoder 134, which provides the row identifier to global interleaver memory 314.

Interleaver 300 is referred to as a local/global interleaver because interleaver 300 performs both local interleaving on a local unit basis and global interleaving on a global unit basis, where (i) the unit basis refers to the number of values treated as a fixed unit for interleaving purposes and (ii) the global unit basis is larger than the local unit basis. For example, in FIG. 3, local interleaver 306 performs interleaving on each set of 96 interleaved channel soft-output values $La_n^{(0)}$, where the local unit basis value (i.e., the number of values treated as a fixed local unit for local interleaving) is one. Thus, local interleaver 306 interleaves 96 local units (i.e., 96 channel soft-output values $La_n^{(0)}$) at the level of the individual value (i.e., value by value) to generate a set of 96 interleaved values.

Global interleaver 310 performs interleaving on twelve sets of 96 interleaved values (assuming that global interleaver 310 is shared between interleavers 126 and 128), where the global unit basis value (i.e., the number of values treated as a fixed global unit for global interleaving) is 96. In particular, global interleaver 310 interleaves the eight sets of 96 values generated by local interleaver 306 (corresponding to the eight user-data block columns of H-matrix 200) and the four sets of 96 values corresponding to parity bits provided by the local interleaver of interleaver 128. Thus, global interleaver 310 interleaves twelve global units (i.e., the 12 sets) at the level of the global unit (i.e., global unit by global unit) to generate twelve interleaved global units, where each global unit is itself a set of 96 interleaved values generated by local interleaver 306. As an alternative, if global interleaver 300 is not shared between interleavers 126 and 128, then global interleaver 300 interleaves only eight global units, where each global unit corresponds to a different set of 96 values generated by local interleaver 306 (i.e., a different user-data block column of H-matrix 200).

Global interleaver 310 performs one example of global interleaving, where the global unit basis is equal to the local set size (i.e., the size of the set of values operated on by the local interleaver). In other words, for every set of 96 values that are interleaved by local interleaver 306, there is a single corresponding global unit of 96 interleaved values that is interleaved by global interleaver 310 with other similar global units of 96 interleaved values also generated by local interleaver 306. As described in relation to FIG. 4 below, in other types of global de-interleaving, the global unit basis may be different from the local set size.

Figure 4:
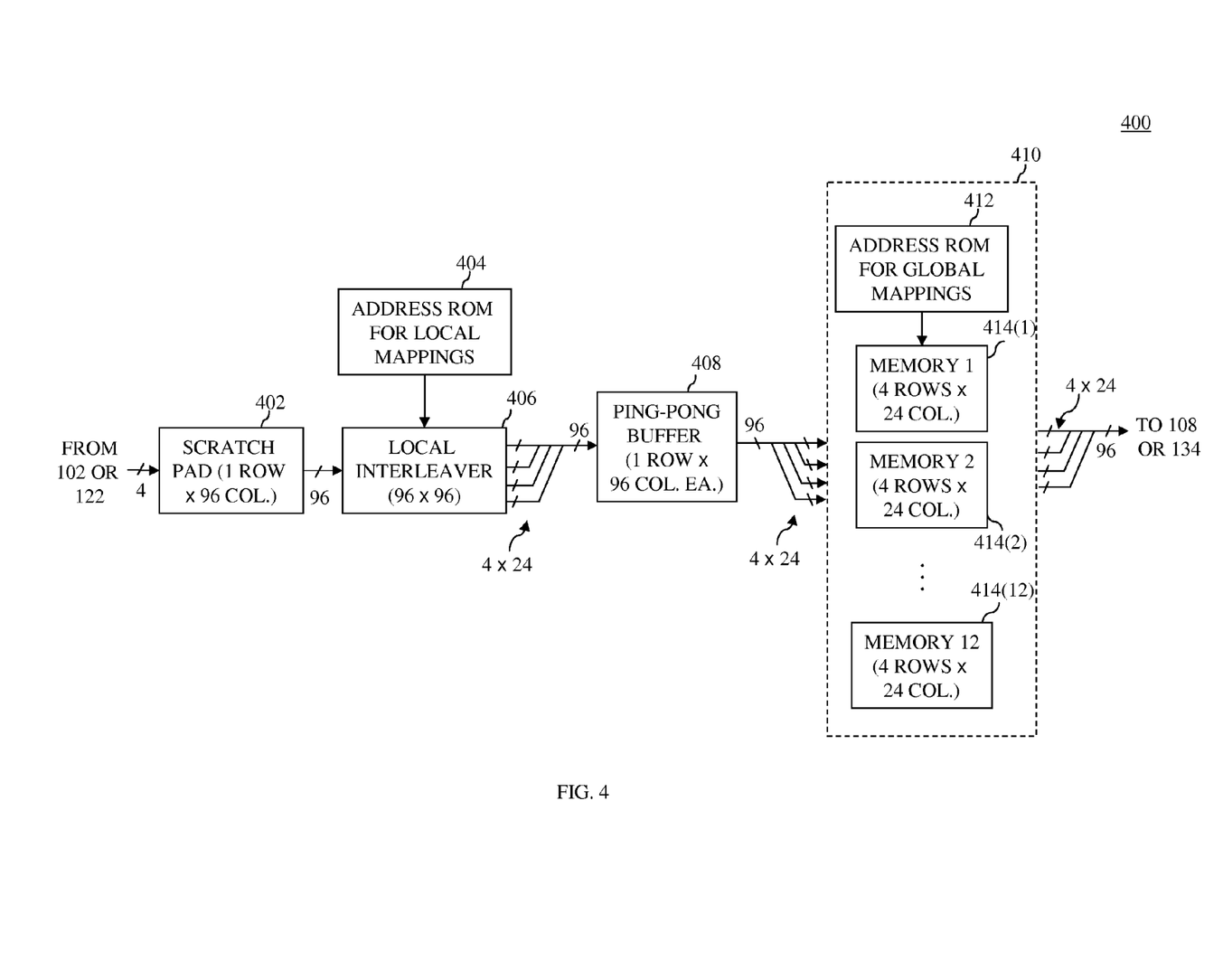
FIG. 4 shows a simplified block diagram of a local/global interleaver according to another embodiment of the present invention that may be used to implement each of the local/global interleavers in FIG. 1.

FIG. 4 shows a simplified block diagram of a local/global interleaver 400 according to another embodiment of the present invention that may be used to implement each of local/global interleavers 106, 126, and 128 in FIG. 1. A discussion of an interleaver that operates in a manner similar to interleaver 400 may be found in U.S. patent application Ser. No. 12/835,989. When used to implement each of interleavers 106, 126, and 128, one skilled in the art would recognize that various parameters used by interleaver 400 may vary depending on which interleaver is being implemented. For example, the size of global interleaver memory 414 may vary, and the size of the values processed by interleaver 400 (e.g., bits vs. soft-values) may vary. For ease of discussion, interleaver 400 is discussed relative to its use in implementing interleaver 126.

Interleaver 400 has scratch pad memory 402, which operates in a manner similar to that of scratch pad memory 302 of FIG. 3. Note, however, as discussed in further detail below, the channel soft-output values $La_n^{(0)}$ in each set of 96 channel soft-output values $La_n^{(0)}$ processed by scratch pad memory 402 correspond to as many as l=4 different block columns of H-matrix 200, where l is the number of input ports for global interleaver 410. This is in contrast to each set of 96 channel soft-output values $La_n^{(0)}$ processed by scratch pad memory 302, which correspond to only one block column of H-matrix 200.

Local interleaver 406 receives the sets of 96 channel soft-output values $La_n^{(0)}$ from scratch pad memory 402 and performs interleaving in a manner similar to that of local interleaver 306 of FIG. 3 (i.e., using mapping instructions received from address ROM 404). One important distinction, however, is that local interleaver 406, in interleaving each set of 96 channel soft-output values $La_n^{(0)}$, re-arranges the channel soft-output values $La_n^{(0)}$ into four subsets of 24 channel soft-output values $La_n^{(0)}$. Each subset of 24 channel soft-output values $La_n^{(0)}$ corresponds to 24 individual columns of one block column of H-matrix 200. The four subsets generated from each set of 96 channel soft-output values $La_n^{(0)}$ correspond to as many as l=4, different block columns of H-matrix 200. Similar to local interleaver 306, the particular mappings implemented by local interleaver 406 preferably vary from one set to the next (i.e., local mapping instructions $\pi_{uL}$ range from $\pi_{uL}(1)$ to $\pi_{uL}(8)$).

After the 96 channel soft-output values $La_n^{(0)}$ in each set are interleaved by local interleaver 406, the 96 channel soft-output values $La_n^{(0)}$ are provided to ping-pong buffer 408, which operates in a manner analogous to that of ping-pong buffer 308. The 96 channel soft-output values $La_n^{(0)}$ are then provided to global interleaver 410, which may be shared between local/global interleavers 126 and 128, or may be used solely by local/global interleaver 126. For this discussion, assume that global interleaver 410 is shared between local/global interleavers 126 and 128, such that global interleaver 410 interleaves channel soft-output values $La_n^{(0)}$ corresponding to all twelve block columns of H-matrix 200 (i.e., the data channel soft-output values $La_n^{(0)}$ corresponding to the eight data block columns of H-matrix 200 received from ping-pong buffer 408 and the parity channel soft-output values $La_n^{(0)}$ corresponding to the four parity block columns of H-matrix 200 received from local/global interleaver 128).

Global interleaver 410 comprises twelve global interleaver memories 414(1)-(12) (eight memories if used solely by local/global interleaver 126) and address ROM 412, which together implement a global interleaving mapping $\pi_G$ to interleave the subsets of 24 channel soft-output values $La_n^{(0)}$ with one another. This is in contrast to global interleaver 310 of FIG. 3, which interleaves sets of 96 channel soft-output values $La_n^{(0)}$ with one another. Note that interleaving mappings $\pi_{uL}$ and $\pi_{uG}$ make up the overall interleaving mapping $\pi_u$ employed by local/global interleaver 126. Each global interleaver memory 414 has 96 total addresses that are arranged into four rows, where each row stores 24 channel soft-output values $La_n^{(0)}$. Global interleaver 410 also has four input ports and four output ports. Each input port provides access for write operations to one row of global interleaver memories 414(1)-(12) at a time (i.e., all 24 addresses), and the four input ports provide access to four different global interleaver memories 414 at a time. Thus, the four input ports provide access to 96 total addresses (i.e., 4×24=96) of global interleaver memories 414(1)-(12), which is the same number of addresses accessed by the input port of global interleaver memory 314 of FIG. 3. Similarly, the four output ports provide access for read operations to four rows of four different global interleaver memories 414 at a time (i.e., 96 addresses total addresses).

For each subset of 24 channel soft-output values $La_n^{(0)}$, address ROM 412 provides an address identifier to global interleaver memories 414(1)-(12), which identifies the row of global interleaver memories 414(1)-(12) to which the 24 channel soft-output values $La_n^{(0)}$ are written. The 24 channel soft-output values $La_n^{(0)}$ are then written via one of the four input ports to the row corresponding to the address identifier.

After all 1,152 channel soft-output values $La_n^{(0)}$ are stored in global interleaver memories 414(1)-(12), they are output to, for example, LDPC decoder 134. In this case, global interleaver memories 414(1)-(12) may be treated as internal memory of LDPC decoder 134, and the order in which the rows are accessed may be determined by the LDPC decoder scheduler. LDPC decoder 134 accesses global interleaver memory 314 four rows (i.e., 96 values) per clock cycle, where each set of four rows corresponds to a single block column of H-matrix 200. The particular rows output are determined by addresses supplied by LDPC decoder 134, which provides the row identifiers to global interleaver memories 414(1)-(12).

Similar to interleaver 300, local interleaver 406 of local/global interleaver 400 performs interleaving on sets of 96 interleaved channel soft-output values $La_n^{(0)}$ on a local unit basis value of one. However, unlike interleaver 300, which performs global interleaving on a global unit basis that is equal to the local set size (i.e., 96), global interleaver 410 performs global interleaving on a global unit basis that is smaller than the local set size. In particular, global interleaver 410 interleaves 48 global units on a global unit basis value of 24, where each global unit has 24 interleaved channel soft-output values $La_n^{(0)}$.

Another way of describing the difference between local/global interleaver 300 and local/global interleaver 400 is that, in local/global interleaver 300, local interleaver 306 generates one global unit for each set of 96 values operated on by local interleaver 306, where each global unit also has 96 values, while, in local/global interleaver 400, local interleaver 406 generates multiple (i.e., four) global units for each set of 96 values operated on by local interleaver 406, where each global unit has only 24 values. In other words, in local/global interleaver 300, the global unit basis value (i.e., 96) is equal to the local set size (i.e., 96), while, in local/global interleaver 400, the global unit basis value (i.e., 24) is smaller than the local set size (i.e., 96). Since local/global interleaver 400 does not process the 96 channel soft-output values $La_n^{(0)}$ corresponding to each block column of H-matrix 200 together as a set, the 96 channel soft-output values $La_n^{(0)}$ can be spread out amongst the other sets, providing greater interleaving flexibility than interleaver 300.

Both interleaver 300 and interleaver 400 can start processing channel soft-output values $La_n^{(0)}$ as soon as they are received from the detector. Further, interleavers 300 and 400 can each process all but the last four received channel soft-output values $La_n^{(0)}$ in parallel with the detector generating other channel soft-output values $La_n^{(0)}$. As a result, interleavers 300 and 400 add only a latency of a few clock cycles to the processing performed by the detector. Thus, for each codeword, interleavers 300 and 400 finish their respective operations at approximately the same time that the detector finishes its operations.

Figure 5:
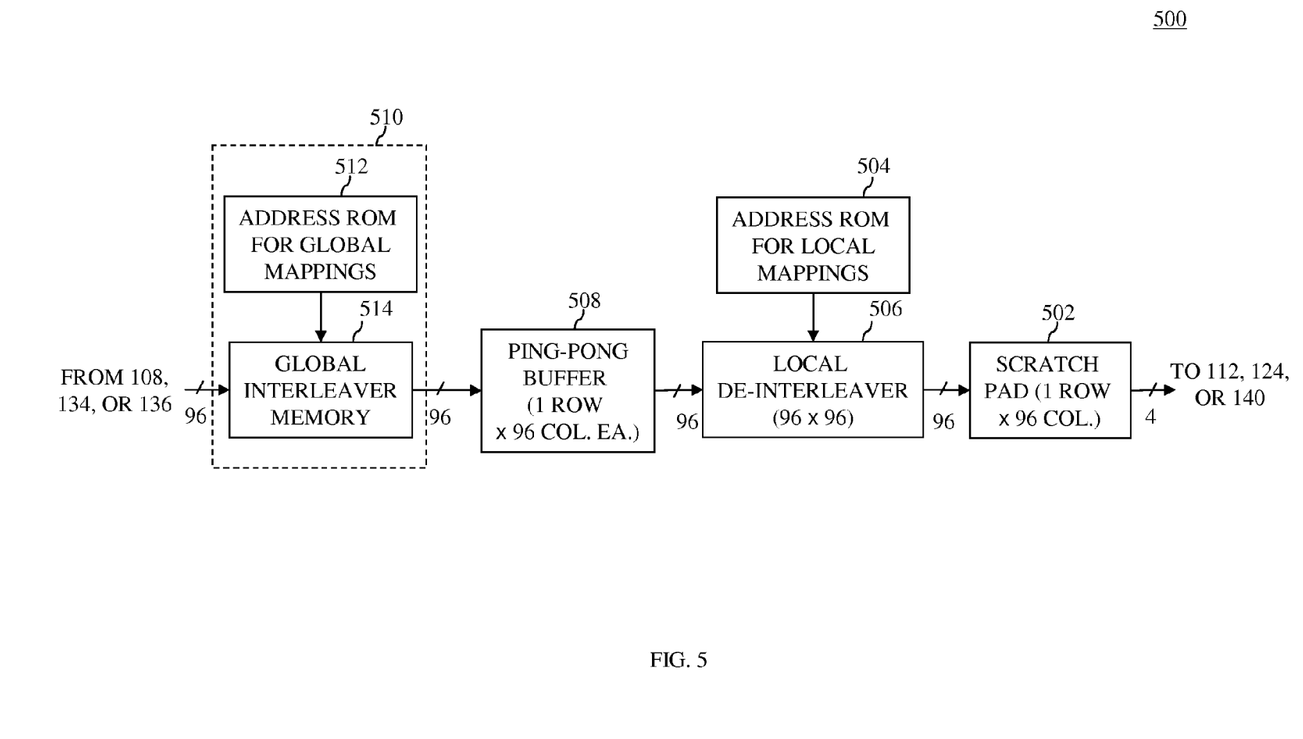
FIG. 5 shows a simplified block diagram of a local/global de-interleaver according to one embodiment of the present invention that may be used to implement each of the local/global de-interleavers in FIG. 1.

The processing of each of interleavers 300 and 400 may be reversed to implement de-interleavers 110, 138, 130, and 132 in FIG. 1. For example, FIG. 5 shows a simplified block diagram of a local/global de-interleaver 500 according to one embodiment of the present invention that may be used to implement each of de-interleavers 110, 138, 130, and 132 in FIG. 1. Local/global de-interleaver 500 implements processing that is the inverse of local/global interleaver 300. When used to implement each of de-interleavers 110, 138, 130, and 132, one skilled in the art would recognize that various parameters used by de-interleaver 500 may vary depending on which de-interleaver is being implemented. For example, the size of global de-interleaver memory 514 may vary, and the size of the values processed by de-interleaver 500 (e.g., bits vs. soft-values) may vary. For ease of discussion, de-interleaver 500 is discussed relative to its use in implementing de-interleaver 130.

Local/global de-interleaver 500 has global de-interleaver 510, which implements a global de-interleaving scheme $\pi_{uG}^{-1}$ that is the inverse of global interleaving scheme $\pi_{uG}$. Global de-interleaver 510 receives sets of 96 extrinsic soft-output values $Le_n$ from LDPC decoder 134, where each set of 96 extrinsic soft-output values $Le_n$ corresponds to a different user-data block column of H-matrix 200. Each set is written to a different row of global de-interleaver memory 514 based on row identifiers provided by address ROM 512. The row identifiers are determined based on the global de-interleaving scheme $\pi_{uG}^{-1}$.

Local/global de-interleaver 130 may share global de-interleaver 510 with local/global de-interleaver 132, in which case, global de-interleaver 510 stores twelve sets of 96 extrinsic soft-output values $Le_n$. Alternatively, local/global de-interleaver 130 might store only eight sets of 96 extrinsic soft-output values $Le_n$ corresponding to only the eight user-data block columns of H-matrix 200. After all of the extrinsic soft-output values $Le_n$ corresponding to an LDPC-encoded codeword are written to global de-interleaver memory 514, the rows of global de-interleaver memory 514 are read out, one at a time, to ping-pong buffer 508, which operates in a manner analogous to ping-pong buffers 308 and 408.

Local de-interleaver 506 implements a local de-interleaving scheme $\pi_{uL}^{-1}$ that is the inverse of local interleaving scheme $\pi_{uL}$. In particular, local de-interleaver 506 de-interleaves the 96 extrinsic soft-output values $Le_n$ in each set based on local mappings provided by address ROM 504. Each set of 96 de-interleaved extrinsic soft-output values $Le_n$ is then provided in parallel to scratch pad 502, which subsequently outputs the 96 de-interleaved extrinsic soft-output values $Le_n$ to multiplexer 124 at a rate of four values per clock cycle.

Figure 6:
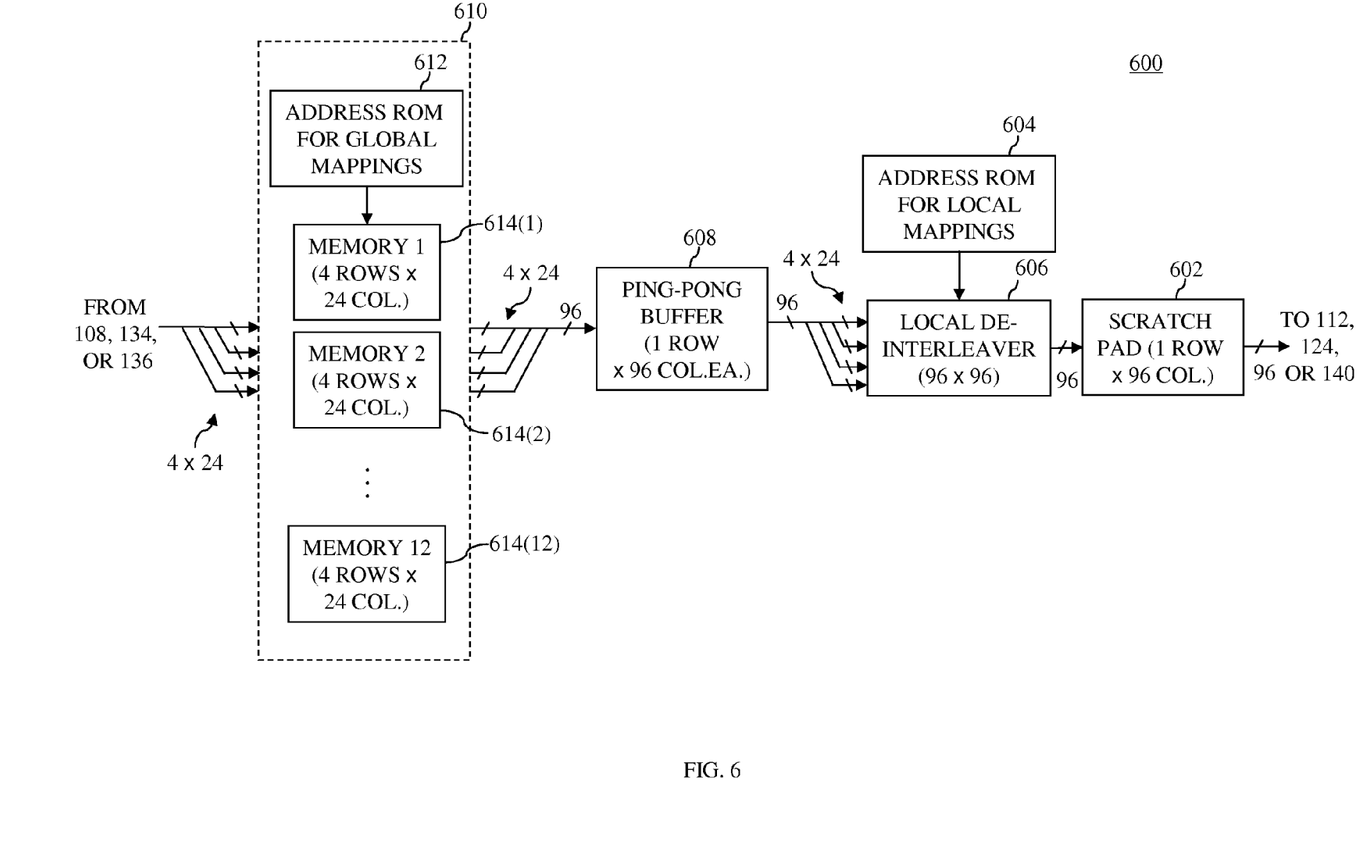
FIG. 6 shows a simplified block diagram of a local/global de-interleaver according to another embodiment of the present invention that may be used to implement each of the local/global de-interleavers in FIG. 1.

FIG. 6 shows a simplified block diagram of a local/global de-interleaver 600 according to another embodiment of the present invention that may be used to implement each of de-interleavers 110, 138, 130, and 132 in FIG. 1. De-interleaver 600 implements processing that is the inverse of interleaver 400. Global de-interleaver 610 has twelve memory banks 614(1)-614(12) and an address ROM 612, which are similar to the equivalent elements of global interleaver 410.

Global interleaver 610 receives four subsets of 24 extrinsic soft-output values $Le_n$, all corresponding to the same block column of H-matrix 200 from the decoder at a time. The four subsets in each group of four subsets received are written to four different rows of memories 614(1) to 614(12) based on row identifiers provided by address ROM 612. After all 1,152 extrinsic soft-output values $Le_n$ are written to memories 614(1)-(12), memories 614(1)-(12) are read out at a rate of four subsets per clock cycle. The subsets are read out based on row identifiers provided by address ROM 612, which spreads the subsets out so that they are de-interleaved. Each group of four subsets (i.e., a set of 96 extrinsic soft-output values $Le_n$) corresponding to user-data block columns of H-matrix 200 is provided to local de-interleaver 606, which implements local de-interleaving mappings $\pi_{uL}^{-1}$ to de-interleave the individual extrinsic soft-output values $Le_n$ from one another. The particular local de-interleaving mappings $\pi_{uL}$ implemented by local de-interleaver 606 may vary from one set to the next.

The 96 extrinsic soft-output values $Le_n$ of each set are (i) provided in parallel to scratch pad memory during one clock cycle and (ii) read out from scratch pad memory 602 to the channel detector at a rate of four extrinsic soft-output values $Le_n$ per clock cycle.

Although the present invention was described relative to the specific H-matrix 200 of FIG. 2, the present invention is not so limited. The present invention may be implemented for various H-matrices that are suitable for message-passing decoding and that are the same size as or a different size from matrix 200 of FIG. 2. For example, the present invention may be implemented for H-matrices in which the number of columns, block columns, rows, block rows, layers (including implementations having only one layer), messages processed per clock cycle, the size of the sub-matrices, the size of the layers, and/or the column and/or row hamming weights differ from that of H-matrix 200. Such H-matrices may be, for example, cyclic, quasi-cyclic, non-cyclic, regular, or irregular H-matrices. H-matrices that are non-cyclic do not have any sub-matrices that are obtained by cyclically shifting an identity matrix. H-matrices that are irregular do not have the same hamming weight $w_r$ for all rows and/or the same hamming weight $w_c$ for all columns. Further, such H-matrices may comprise sub-matrices other than circulants including zero matrices.

It will be further understood that various changes in the details, materials, and arrangements of the parts which have been described and illustrated in order to explain the nature of this invention may be made by those skilled in the art without departing from the scope of the invention as expressed in the following claims. For example, the number of channel soft-output values $La_n^{(0)}$ provided from channel detector 120 may be greater than or less than four channel soft-output values $La_n^{(0)}$ per clock cycle depending on how the channel detector(s) are implemented. As another example, the number of input and output ports of global interleaver 410 may be greater than or less than four, and the number of channel soft-output values $La_n^{(0)}$ accessed per input and output port may be greater than or less than 24. As yet another example, the number of global interleaver memories 414 and the size of global interleaver memories 414 may vary from one embodiment to the next. As even yet another example, scratch pads 302 and 402 and local interleavers 306 and 406 could be sized to process a number of channel soft-output values $La_n^{(0)}$ other than p. For instance, scratch pad memory 402 and local interleaver 406 could process 2p channel soft-output values $La_n^{(0)}$, where each set of p channel soft-output values $La_n^{(0)}$ corresponds to a different block column of H-matrix 200, or p/2 channel soft-output values $La_n^{(0)}$ corresponding to half of one block column of H-matrix 200. The number of input ports, output ports, the size of global interleaver memories 414, and the number of soft-values memories 414 may be changed to accommodate the change in the number of channel soft-output values $La_n^{(0)}$ processed by scratch pad memory 402 and local interleaver 406.

Various embodiments of the present invention may be implemented using a local unit basis and/or a global unit basis other than those discussed above in relation to FIGS. 3 and 4. For example, embodiments of the present invention may be envisioned in which the local interleaver performs interleaving on sets of channel soft-output values $La_n^{(0)}$ on a local unit basis value of two (e.g., two-value local units are interleaved with other two-value local units). As another example, various embodiments may be envisioned in which the global de-interleaver performs global de-interleaving on a global unit basis value of twelve (e.g., 96 twelve-value global units are de-interleaved global unit by global unit). In that case, for each set of 96 values, the local de-interleaver would generate eight twelve-value global units for the global interleaver.

Although the present invention was described as sharing global memories 314 and 414 between data interleaver 126 and parity interleaver 128, the present invention is not so limited. Local/global interleavers of the present invention may be implemented having separate global memories for data interleaver 126 and parity interleaver 128. Similarly, various embodiments of the present invention may be envisioned in which de-interleavers 132 and 130 have separate global memories.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the invention. The present invention can also be embodied in the form of program code, for example, stored in a non-transitory machine-readable storage medium including being loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

The present invention can also be embodied in the form of a bitstream or other sequence of signal values stored in a non-transitory recording medium generated using a method and/or an apparatus of the present invention.

Unless explicitly stated otherwise, each numerical value and range should be interpreted as being approximate as if the word "about" or "approximately" preceded the value of the value or range.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A communications transmitter adapted to convert an input data stream into an encoded data stream for transmission, the communications transmitter comprising:
   a local/global interleaver (e.g., 106) adapted to perform both local and global interleaving on the input data stream to generate an interleaved input data stream;
   an error-correction encoder (e.g., 108) adapted to encode the interleaved input data stream to generate a stream of interleaved parity values corresponding to an error-correction-encoded codeword;
   a local/global de-interleaver (e.g., 110) adapted to perform both local and global de-interleaving on the stream of interleaved parity values to generate a stream of de-interleaved parity values; and
   a multiplexer (e.g., 112) adapted to multiplex the input data stream and the de-interleaved parity values to generate the encoded data stream.

2. The transmitter of claim 1, wherein:
   the local/global interleaver (e.g., 300, 400) comprises:
      a local interleaver (e.g., 306, 406) adapted to:
         receive a first set of multiple data values corresponding to the input data stream;
         interleave, on a local data unit basis, the first set of data values to generate a first group of one or more global data units;
         receive a second set of multiple data values corresponding to the input data stream; and
         interleave, on the local data unit basis, the second set of data values to generate a second group of one or more global data units; and
      a global interleaver (e.g., 310, 410) adapted to:
         receive the first and second groups of global data units from the local de-interleaver; and
         interleave, on a global data unit basis, greater than the local data unit basis, the first and second groups of global data units to generate the interleaved input data stream; and
   the local/global de-interleaver (e.g., 500, 600) comprises:
      a global de-interleaver (e.g., 510, 610) adapted to de-interleave, on a global parity unit basis, sets of parity values in the stream of interleaved parity values to generate a plurality of de-interleaved global parity units, each global parity unit having multiple values corresponding to the stream of interleaved parity values; and
      a local de-interleaver (e.g., 506, 606) adapted to:
         receive a first group of one or more global parity units from the global de-interleaver;
         de-interleave, on a local parity unit basis, lower than the global parity unit basis, the first group of global parity units to generate a first set of de-interleaved parity values of the stream of de-interleaved parity values;
         receive a second group of one or more global parity units from the global de-interleaver; and
         de-interleave, on the local parity unit basis, the second group of global parity units to generate a second set of de-interleaved parity values of the stream of de-interleaved parity values.

3. The transmitter of claim 2, wherein:
each group of one or more global data units has exactly one global data unit, wherein the global data unit is equal in size to a set of multiple data values; and
each group of one or more global parity units has exactly one global parity unit, wherein the global parity unit is equal in size to a set of de-interleaved parity values.

4. The transmitter of claim 2, wherein:
each group of one or more global data units has two or more global data units, wherein each global data unit is smaller in size than a set of multiple data values; and
each group of one or more global parity units has two or more global parity units, wherein a global parity unit is smaller in size than a set of de-interleaved parity values.

5. The transmitter of claim 2, wherein:
the local data unit is the same size as the local parity unit; and
the global data unit is the same size as the global parity unit.

6. The transmitter of claim 5, wherein:
the error-correction-encoded codeword is a low-density parity-check-encoded codeword that is generated based on a parity-check matrix;
a number of data values in a global data unit is equal to a number of columns in a block column of the parity-check matrix; and
a number of parity values in a global parity unit is equal to the number of columns in the block column of the parity-check matrix.

7. The transmitter of claim 5, wherein:
the error-correction-encoded codeword is a low-density parity-check-encoded codeword that is generated based on a parity-check matrix;
a number of data values in a global data unit is less than a number of columns in a block column of the parity-check matrix; and
a number of parity values in a global parity unit is less than the number of columns in the block column of the parity-check matrix.

8. The transmitter of claim 1, wherein the error-correction encoder is a low-density parity-check encoder.

9. A communications system implemented method for converting an input data stream into an encoded data stream for transmission, the method comprising:
(a) performing both local and global interleaving (e.g., 106) on the input data stream to generate an interleaved input data stream;
(b) performing error-correction encoding (e.g., 108) on the interleaved input data stream to generate a stream of interleaved parity values corresponding to an error-correction-encoded codeword;
(c) performing both local and global de-interleaving (e.g., 110) on the stream of interleaved parity values to generate a stream of de-interleaved parity values; and
(d) multiplexing (e.g., 112) the input data stream and the de-interleaved parity values to generate the encoded data stream.

10. A communications receiver adapted to recover, from an encoded data stream, an original data stream, the communications receiver comprising:
a local/global interleaver (e.g., 126, 128) adapted to perform both local and global interleaving on a stream of channel values to generate a stream of interleaved channel values, wherein each channel value corresponds to a value in the encoded data stream;
an error-correction decoder (e.g., 134) adapted to decode the stream of interleaved channel values to recover an error-correction-encoded codeword, wherein the error-correction-encoded codeword comprises both data values and parity values; and
a local/global de-interleaver (e.g., 138) adapted to perform both local and global de-interleaving on the data values of the error-correction-encoded codeword to generate the original data stream.

11. The receiver of claim 10, wherein the communications receiver further comprises:
a channel detector (e.g., 120) adapted to perform channel detection on the encoded data stream to generate the stream of channel values; and
an extrinsic local/global de-interleaver (e.g., 130, 132) adapted to:
receive a stream of interleaved extrinsic values from the error-correction decoder;
perform both local and global de-interleaving on the stream of interleaved extrinsic values to generate a stream of de-interleaved extrinsic values; and
provide the stream of de-interleaved extrinsic values to the channel detector for improved channel detection.

12. The receiver of claim 10, wherein:
the local/global interleaver (e.g., 300, 400) comprises:
a local interleaver (e.g., 306, 406) adapted to:
receive a first set of multiple channel values corresponding to the encoded data stream;
interleave, on a local channel unit basis, the first set of channel values to generate a first group of one or more global channel units;
receive a second set of multiple channel values corresponding to the encoded data stream; and
interleave, on the local channel unit basis, the second set of channel values to generate a second group of one or more global channel units; and
a global interleaver (e.g., 310, 410) adapted to:
receive the first and second groups of global channel units from the local interleaver; and
interleave, on a global channel unit basis, greater than the local channel unit basis, the first and second global channel units to generate the stream of interleaved channel values; and
the local/global de-interleaver (e.g., 500, 600) comprises:
a global de-interleaver (e.g., 510, 610) adapted to de-interleave, on a global data unit basis, sets of data values of the error-correction-encoded codeword to generate a plurality of de-interleaved global data units, each global data unit having multiple data values; and
a local de-interleaver (e.g., 506, 606) adapted to:
receive a first group of one or more global data units from the global interleaver;
de-interleave, on a local data unit basis, lower than the global data unit basis, the first group of global data units to generate a first set of de-interleaved data values of the original data stream;
receive a second group of one or more global data units from the global interleaver; and
de-interleave, on the local data unit basis, the second group of global data units to generate a second set of de-interleaved data values of the original data stream.

13. The receiver of claim 12, wherein:
each group of one or more global channel units has exactly one global channel unit, wherein a global channel unit is equal in size to a set of multiple channel values; and each group of one or more global data units has exactly one global data unit, wherein a global data unit is equal in size to a set of de-interleaved data values.

14. The receiver of claim 12, wherein:

each group of one or more global channel units has two or more global channel units, wherein a global channel unit is smaller in size than a set of multiple channel values; and each group of one or more global data units has two or more global data units, wherein a global data unit is smaller in size than a set of de-interleaved data values.

15. The receiver of claim 12, wherein:

the local channel unit is the same size as the local data unit; and the global channel unit is the same size as the global data unit.

16. The receiver of claim 15, wherein:

the error-correction-encoded codeword is a low-density parity-check-encoded codeword that is generated based on a parity-check matrix;

a number of channel values in a global channel unit is equal to a number of columns in a block column of the parity-check matrix; and a number of data values in a global data unit is equal to the number of columns in the block column of the parity-check matrix.

17. The receiver of claim 15, wherein:

the error-correction-encoded codeword is a low-density parity-check-encoded codeword that is generated based on a parity-check matrix;

a number of channel values in a global data unit is less than a number of columns in a block column of the parity-check matrix; and a number of data values in a global parity unit is less than the number of columns in the block column of the parity-check matrix.

18. The receiver of claim 10, wherein the error-correction decoder is a low-density parity-check decoder.

19. A communications receiver implemented method for recovering, from an encoded data stream, an original data stream, the method comprising:

(a) performing both local and global interleaving (e.g., 126, 128) on a stream of channel values to generate a stream of interleaved channel values, wherein each channel value corresponds to a value in the encoded data stream;

(b) decoding (e.g., 134) the stream of interleaved channel values to recover an error-correction-encoded codeword, wherein the error-correction-encoded codeword comprises both data values and parity values; and (c) performing both local and global de-interleaving (e.g., 138) on the data values of the error-correction-encoded codeword to generate the original data stream.

* * * * *